United States Patent [19]

Ahmed

[11] 3,868,581

[45] Feb. 25, 1975

[54] CURRENT AMPLIFIER

[75] Inventor: Adel Abdel Aziz Ahmed, Annandale, N.J.

[73] Assignee: RCA Corporation, New York, N.Y.

[22] Filed: July 20, 1973

[21] Appl. No.: 381,175

[52] U.S. Cl. ........................ 330/19, 330/18, 330/22, 330/23

[51] Int. Cl. ............................................ H03f 3/42

[58] Field of Search ......... 330/18, 19, 22, 38 M, 40, 330/23

[56] References Cited

UNITED STATES PATENTS 3,532,909 10/1970 Buckley ........................... 330/40 X

*Primary Examiner*—Rudolph V. Rolinec
*Assistant Examiner*—Lawrence J. Dahl
*Attorney, Agent, or Firm*—H. Christoffersen, S. Cohen, A. L. Limberg

[57] ABSTRACT

A first grounded-emitter amplifier transistor is followed in direct coupled cascade by a second grounded-emitter amplifier transistor. The first grounded-emitter transistor has direct-coupled collector-to-base negative feedback to regulate its collector current to be proportional to applied input current. The direct-coupled feedback includes means to regulate the collector-to-base potential of said first transistor to be proportional to the logarithm of the applied input current. The collector current of the second transistor is thereby in fixed proportion to the applied input current and independent of the forward current gain of the transistors.

4 Claims, 4 Drawing Figures

CURRENT AMPLIFIER

Figure 1:
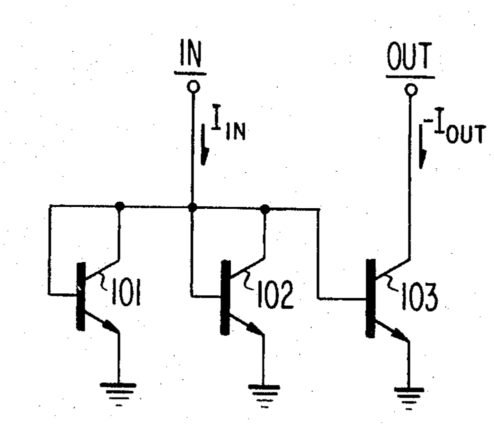
( PRIOR ART ) Fig. 1.

The present invention relates to current amplifiers suited for use in monolithic integrated circuits.

Prior art integrated-circuit current amplifier use first and second grounded-emitter amplifier transistors, the first preceding the second in a direct-coupled cascade connection, and having collector-to-base negative feedback to regulate its collector current to equal an applied input current. The output current flowing in the collector-to-emitter path of the second transistor is proportionally related to the applied input current in a ratio equal to the effective base-emitter junction area of the second transistor to that of the first. The gain of such a current amplifier is well-determined, being essentially independent of the common-emitter forward current gains of the first and second transistors.

In the current amplifiers of the present invention the collector-to-base feedback includes means for providing a potential between the collector and base electrodes of the first transistor which varies proportionally with the absolute temperature of the first and second transistors. This permits current amplifiers having gains appreciably higher or lower than unity to be placed in a smaller area on a monolithic integrated circuit than possible with the prior art circuit.

In the drawing:

FIG. 1 is a schematic diagram of a representative prior art configuration for realizing a current gain that is a fraction of unity.

Figure 2:
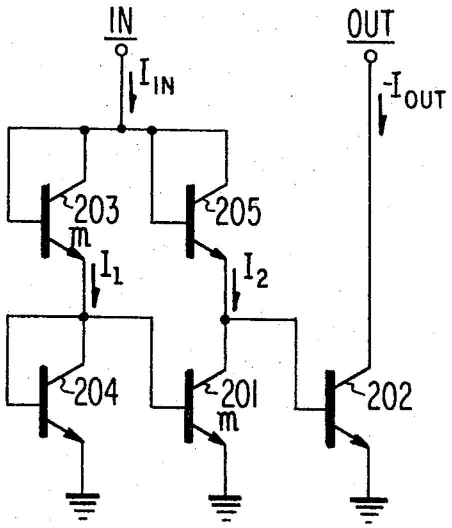
Figure 3:
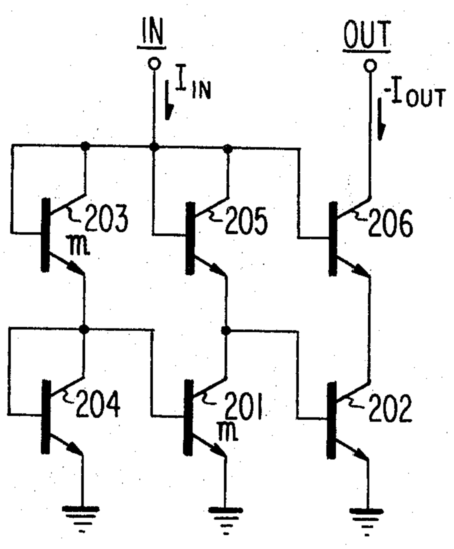
Figure 4:
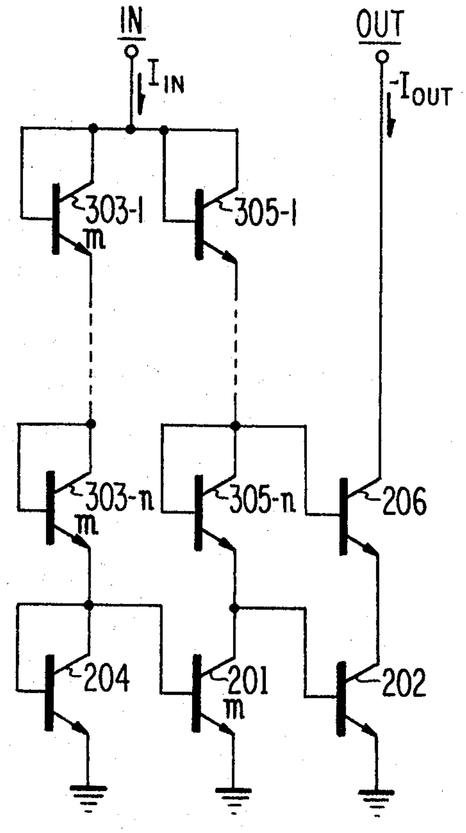

FIGS. 2, 3, and 4 are schematic diagrams showing alternative embodiments of the present invention.

FIG. 1 transistors 101, 102 and 103 are presumed to have identical geometries and like operating characteristics and to be located near each other within the confines of the same integrated circuit. Transistors 101 and 102 are each connected as a semiconductor diode, its joined base and collector electrodes providing the anode of the diode and its emitter electrode providing the cathode of the diode.

The parallelled transistors 101 and 102, as is well known, are the equivalent of a single transistor having an effective base-emitter junction area equal to the sum of their effective base-emitter junction areas. Where a single transistor is shown in the subsequent FIGS. 2, 3 and 4 it should be understood that a conventional transistor symbol may represent such a composite transistor comprising parallelled component transistors.

The collector-to-base connections of transistors 101 and 102 are degenerative or negative feedback connections which regulate their base-emitter potentials ($V_{BE101}$ and $V_{BE102}$, respectively) to values which support collector current flows substantially equal to one-half $I_{IN}$, the current applied via terminal IN to their coupled collector electrodes.

(A small fraction of the current $I_{IN}$ is used to supply the base currents of transistors 101, 102 and 103. The common-emitter forward current gains, or $h_{fe}$'s, of these transistors commonly exceed 30 and the base currents are negligibly small compared to the collector currents of transistors 101 and 102. The effects of base current upon the gains of current amplifiers described herein will ignore base currents, the methods of calculating their effects being known to those skilled in the art of transistor electronics design.)

Transistor 103 has a base-emitter potential, $V_{BE103}$, equal to $V_{BE101}$ and $V_{BE102}$. It is a well known fact that the base-emitter offset potential ($V_{BE}$) of a transistor is a logarithmic function of the average current density in its base-emitter junction. This relationship is often expressed in the following form:

$$V_{BE} = (kT/q)\ \ln\ (I_C/I_S) \tag{1}$$

where k is Boltzmann's constant,

T is absolute temperature q is the charge on an electron, $I_C$ is the collector current of the transistor, and $I_S$ is the saturation current of the transistor.

Another well known equation expresses the relationship between $V_{BE1}$ and $V_{BE2}$ of first and second transistors, having similar diffusion profiles respectively, for the same value of collector current, where the effective base-emitter junction area of the first transistor is m times as large as that of the second, i.e.:

$$V_{BE1} = V_{BE2} - (kT/q)\ \ln\ m \tag{2}$$

From this equation, the relationship between the $I_S$ value of different transistors may be inferred. If the transistors have similar geometries and are of the same temperature, their $I_S$ values are equal.

The collector currents of transistors 101 and 102 ($I_{C101}$ and $I_{C102}$) are each equal to ½ $I_{IN}$. This must be so since their $V_{BE}$'s ($V_{BE101}$ and $V_{BE102}$) are alike because of their base-emitter junctions being parallelly connected, their temperatures are alike because of proximity within the integrated circuit, and their saturation currents are alike because of their similar geometries. The collector current of transistor 103 must be equal to ½ $I_{IN}$ for the same reasons.

The gain of the current amplifier shown in FIG. 1 is therefore 1/m, where m is the ratio of the number of diode-connected transistors parallelled in the input circuit to the number of transistors parallelled in its output circuit, presuming all the transistors to have similar geometries. More generally, the gain of the current amplifier is 1/m where *m* is the ratio of the sum of the effective base-emitter junction area(s) of the diode-connected transistor(s) in its input circuit to the sum of the effective base-emitter junction area(s) of the transistor(s) in its output circuit.

It is convenient to compare the areas upon the integrated circuit of alternative circuits required to realize a certain current gain by expressing the number of like geometry transistors required to realize that gain. The current amplifier of FIG. 1 requires *m* + 1 like geometry transistors to obtain a current gain of 1/m where *m* is a positive integer. Current amplifiers providing a current gain of *m* are known which comprise a single diode-connected transistor in their input circuit and m parallelled transistors in their output circuit.

FIG. 2 shows a current amplifier in which a regulating transistor 201 controls the potential applied to the base emitter junction of an output transistor 202. However, a potential difference is maintained between $V_{BE201}$ and $V_{BE202}$, their base-emitter potentials, by the action of diode-connected transistors 203, 204 and 205. The effects of base currents upon the total currents flowing in the various branches of the network are generally negligible, since the $h_{fe}$'s of the component transistors normally exceed 30. If desired, however, the effects of these base currents can be calculated according to well known principles.

For the following analysis of how the configuration in FIG. 2 may be employed, the geometries of transistors 201 and 203 are presumed similar to each other and the geometries of transistors 202, 204 and 205 are also presumed to be similar to each other. The effective base-emitter junction area of each of the transistors 201 and 203 are presumed to be m times as large as the effective base-emitter junction area of each of the transistors 202, 204 and 205.

The current supplied to the IN terminal, $I_{IN}$, is divided into (1) and $I_1$ component flowing through the serially connected collector-to-emitter paths of diode-connected transistors 203 and 204 and (2) and $I_2$ component flowing through the serially-connected collector-to-emitter paths of diode-connected transistor 205 and transistor 201. Since the transistor 201 has an effective base-emitter junction area m times as large as that of transistor 204:

$$I_2 = mI_1 \tag{3}$$

This follows since the parallel connection of the base-emitter junctions of transistors 201 and 204 constrains the potentials $V_{BE201}$ and $V_{BE204}$, respectively, developed across them to be equal, thus causing the current densities in their base-emitter junctions to be equal.

According to equation 1, $V_{BE204}$ is given by the expression below.

$$V_{BE204} = (kT/q)\ \ln\ (I_1/I_{S204}) \tag{4}$$

The current $I_1$ also flows through diode-connected transistor 203 causing it to have a base-emitter potential $V_{BE203}$. By equation 2:

$$V_{BE203} = V_{BE204} - (kT/q)\ \ln\ m \tag{5}$$

The base-emitter potential $V_{BE205}$ of transistor 205 is given by the expression below.

$$V_{BE205} = (kT/q)\ \ln\ (I_2/I_{S205}) \tag{6}$$

Since diode-connected transistors 204 and 205 have similar geometries, $$I_{S205} = I_{S204} \tag{7}$$

Substituting equations 3 and 7 into equation 6,

$$\begin{aligned} V_{BE205} &= (kT/q)\ \ln\ m\ (I_1/I_{S204}) \\ &= kT/q\ \ln\ (I_1/I_{S204}) + (kT/q)\ \ln\ m \end{aligned} \tag{8}$$

The potential applied between the base and emitter electrodes of transistor 202, $V_{BE202}$, is determined by the regulating action of diode-connected transistors 203, 204 and 205 as expressed in equations 4, 5 and 8.

$$V_{BE202} = V_{BE203} + V_{BE204} - V_{BE205} \tag{9}$$

$$\begin{aligned} &= (V_{BE204} - kT/q\ \ln\ m) + V_{BE204} - \\ &\quad (V_{BE204} + (kT/q)\ \ln\ m) \\ &= V_{BE204} - 2(kT/q)\ \ln\ m \end{aligned}$$

$$V_{BE202} = V_{BE204} - (kT/q)\ \ln\ m^2. \tag{10}$$

Referring to equation 2, it is seen that transistor 202 must have a collector current flow $-I_{OUT}$ equal to that of a transistor having the same $V_{BE}$ as transistor 204 but an effective base-emitter junction area $m^2$ times smaller than that of transistor 204. That is, the current density in the base-emitter junction of transistor 202 is only $1/m^2$ times as large as that in the base-emitter junction of transistor 204. Therefore:

$$-I_{OUT} = I_1/m^2 \tag{11}$$

Now, since $I_{IN}$ equals the sum of $I_1$ and $I_2$:

$$I_1 = I_{IN} - I_2 \tag{12}$$

Substituting from equation 3 into equation 12 and rearranging:

$$I_1 = I_{IN} - mI_1 = I_{IN}/m+1 \tag{13}$$

Substituting $I_1$ from equation 13 into equation 11:

$$-I_{OUT} = I_{IN}/m^2(m+1) \tag{14}$$

The transistors 201 and 203 may be constructed of m parallelled transistors of the same geometry as transistors 202, 204 and 205 if m equals a positive integer. The transistsors 202, 204 and 205 may be constructed of m parallelled transistors of the same geometry as transistors 201 and 203 if m equals unity divided by a positive integer. Analyzing an equivalent circuit comprised of standard geometry transistors permits comparing the integrated circuit chip areas required for various amplifiers having a particular current gain. The following table compares the relative area requirements for current amplifiers of a given current gain of the configurations shown in FIGS. 1 and 2, respectively. These area requirements are expressed in terms of the number of standard geometry or "unit" transistors required to achieve the desired ratio of $I_{OUT}$ to $I_{IN}$ for the respective configuration.

| $I_{OUT}/I_{IN}$ | No. OF UNIT TRANSISTORS REQUIRED | |
|---|---|---|
| | FIGURE 1 AMPLIFIER | FIGURE 2 AMPLIFIER |
| 1/1210 | 1211 | 25 |
| 1/900 | 901 | 23 |
| 1/810 | 811 | 21 |
| 1/576 | 577 | 19 |
| 1/392 | 393 | 17 |
| 1/252 | 253 | 15 |
| 1/150 | 151 | 13 |
| 1/80 | 81 | 11 |
| 1/36 | 37 | 9 |
| 1/12 | 13 | 7 |
| 1/2 | 3 | 5 |

TABLE 1

Area Requirements of IC Current Amplifiers

As can be seen from the table, the FIG. 2 configuration provides small $I_{OUT}$ currents as compared to $I_{IN}$ current with substantially less area requirement than the FIG. 1 configuration when $I_{OUT}/I_{IN}$ is substantially smaller than unity.

FIG. 3 shows how a transistor 206 may be connected as a common-base amplifier of the collector current of transistor 202 to provide $-I_{OUT}$ as its collector current. The current gain of the common-base amplifier is substantially unity. The base-emitter offset potential of transistor 206 biases the collector electrode of transistor 202 so its collector-to-emitter voltage is substantially a 1 $V_{BE}$ voltage similar to that of transistors 201, 203, 204 and 205. This tends to make the actual circuit behave in a manner even more closely approaching the theoretical performance previously described, since minor current gain variations amongst transistors due to differing collector-to-emitter potentials are strongly reduced.

FIG. 4 shows a current amplifier resembling that of FIG. 3 except that (1) a serial combination of N diode-connection transistors 303-1 through 303-n each having an effective base-emitter junction area similar to transistor 201 replaces diode-connected transistor 203 and (2) that a serial combination of N diode-connected transistors 305-1 through **305-*n* each having equal effective base-emitter areas 1/m times that of transistor 201 replaces diode-connected transistor 205. By extension of the technique used to analyze the current amplifier of FIG. 1, the current gain of the current amplifier shown in FIG. 4** can be shown to be:

$$I_{OUT}/I_{IN} = 1/m^{2N}(m+1) \tag{15}$$

which for $N$=1 degenerates to the expression in equation 14. For a configuration where $N$=2, $m$=6 a value of 1/9072 can be developed for $I_{OUT}/I_{IN}$ using only 22 unit transistors. For a configuration where $N$=3 and $m$=4, $I_{OUT}/I_{IN}$ equals 1/20480 and is developed using only 21 unit area transistors. For a configuration where $N$=4 and $m$=3, $I_{OUT}/I_{IN}$ equals 1/26244 and is developed using only 21 unit area transistors.

This general structure may also be used for current amplifiers having higher $I_{OUT}$ than $I_{IN}$ by making transistors 201, 202 and 303-1 through 303-n with the same geometry and by making transistors 204 and 305-1 through **305-*n*** with effective base-emitter junction areas m times as large. Such a current amplifier theoretically has a gain:

$$I_{OUT}/I_{IN} = M^{2N+1}/(m+1) \tag{16}$$

The area advantage over conventional current amplifiers is not so great when gain exceeds unity as it is for gain less than unity, however. Further, the effects of base currents are not so negligible.

Other scalings of the effective base-emitter junction areas of transistors used in current amplifier configurations shown in FIGS. 2, 3 and 4 may be advantageous in certain situations. The diode-connected transistors may also be replaced by other integrated circuit diode structures in suitable circumstances. The word "diode" in the claims denotes a diode-connected transistor as well as these alternative diode structures.

What is claimed is:

1. A current amplifier comprising:

an input, a common and an output terminal;

first and second transistors operated at substantially the same absolute temperature T, each having an emitter electrode connected to said common terminal and each having a base and a collector electrode, each having a base-emitter junction between its base and emitter electrodes, said first transistor collector electrode being direct current conductively coupled to said input terminal and directly connected to said second transistor base electrode;

means for coupling said second transistor collector electrode to said output terminal, and a direct-coupled collector-to-base degenerative feedback connection of said first transistor consisting of means responsive to the absolute temperature T to provide between a first and a second of its terminals a potential proportional to T, said first and said second terminals being respectively connected to said first transistor collector electrode and to said first transistor base electrode.

2. A current amplifier as claimed in claim 1 wherein said direct-coupled collector-to-base degenerative feedback connection comprises:

a number $2N+1$ of diodes each operated at an absolute temperature substantially equal to T, N being a positive integer, the first of which diodes is connected between the base and the emitter electrodes of said first transistor to parallel its base-emitter junction, a first half of the remainder coupled between said input terminal and said first transistor base electrode, and in series connection with said first diode, a second half of the remainder coupled between said input terminal and said first transistor collector electrode and in series connection with the collector-to-emitter path of said first transistor.

3. A current amplifier as claimed in claim 2 wherein said means coupling said second transistor collector electrode to said output terminal comprises a third transistor connected as a common base amplifier to couple said second transistor collector electrode to said output terminal.

4. A current amplifier as claimed in claim 3 wherein the base electrode of said third transistor is connected to an interconnection in the series connection of said second half of the remainder of said diodes.

* * * * *